(12) United States Patent
Prince

(10) Patent No.: US 8,718,298 B2
(45) Date of Patent: May 6, 2014

(54) NVH DEPENDENT PARALLEL COMPRESSION PROCESSING FOR AUTOMOTIVE AUDIO SYSTEMS

(75) Inventor: David J. Prince, Villa Park, IL (US)

(73) Assignee: Lear Corporation, Southfield, MI (US)

( * ) Notice: Subject to any disclaimer, the term of this patent is extended or adjusted under 35 U.S.C. 154(b) by 1558 days.

(21) Appl. No.: 10/741,772

(22) Filed: Dec. 19, 2003

(65) Prior Publication Data

US 2005/0135635 A1 Jun. 23, 2005

(51) Int. Cl.
*H04B 1/00* (2006.01)

(52) U.S. Cl.
USPC ............. 381/86; 381/57; 381/106; 381/107

(58) Field of Classification Search
CPC ............ H03G 3/20; H03G 7/00; H03G 3/00; H04B 1/00
USPC ............ 381/86, 109, 94.1–2, 71.4, 104–107, 381/16, 57, 102, 103, 98
See application file for complete search history.

(56) References Cited

U.S. PATENT DOCUMENTS

| | | | |
|---|---|---|---|
| 4,490,843 A * | 12/1984 | Bose et al. | 381/102 |
| 4,490,943 A * | 1/1985 | McLaughlin | 49/478.1 |
| 4,665,770 A * | 5/1987 | Van Selous | 477/60 |
| 4,680,798 A | 7/1987 | Neumann | |
| 4,739,514 A * | 4/1988 | Short et al. | 381/103 |
| 4,922,537 A | 5/1990 | Frederiksen | |
| 5,445,125 A * | 8/1995 | Allen | 123/399 |
| 5,832,097 A * | 11/1998 | Armstrong et al. | 381/321 |
| 5,872,852 A * | 2/1999 | Dougherty | 381/57 |
| 6,055,502 A | 4/2000 | Kitamura | |
| 6,351,733 B1 | 2/2002 | Saunders et al. | |
| 6,438,513 B1 | 8/2002 | Pastor et al. | |
| 6,449,596 B1 | 9/2002 | Ejima | |
| 6,535,847 B1 | 3/2003 | Marston | |
| 6,690,805 B1 * | 2/2004 | Tsuji et al. | 381/94.1 |
| 2002/0040295 A1 | 4/2002 | Saunders et al. | |
| 2002/0057808 A1 * | 5/2002 | Goldstein | 381/106 |
| 2002/0057809 A1 * | 5/2002 | Heyl | 381/119 |
| 2002/0091905 A1 | 7/2002 | Geiger et al. | |
| 2002/0133356 A1 | 9/2002 | Romesburg | |
| 2002/0163455 A1 | 11/2002 | Reefman et al. | |
| 2002/0173865 A1 * | 11/2002 | Frindle | 700/94 |
| 2002/0173950 A1 | 11/2002 | Vierthaler | |
| 2003/0003944 A1 | 1/2003 | Rosenzweig | |
| 2003/0125933 A1 | 7/2003 | Saunders et al. | |
| 2004/0071297 A1 * | 4/2004 | Katou et al. | 381/61 |

\* cited by examiner

*Primary Examiner* — Disler Paul
(74) *Attorney, Agent, or Firm* — MacMillan, Sobanski & Todd, LLC

(57) ABSTRACT

A method is provided for controlling a dynamic range of audio reproduction in an interior of a vehicle. An input audio signal is received by an audio processor. The input audio signal is split into a first and a second processing path. The input audio signal of the second processing path is compressed. A noise-related parameter of the vehicle is characterized. A gain control is applied to the compressed audio signal of the second processing path in response to the noise-related parameter. The compressed and uncompressed audio signals are synchronously recombined. The combined audio signal is reproduced to the interior of the vehicle.

16 Claims, 4 Drawing Sheets

NVH DEPENDENT PARALLEL COMPRESSION PROCESSING FOR AUTOMOTIVE AUDIO SYSTEMS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to compressing an audio signal for compensating for the effects of noise masking in a vehicle, and more specifically, for controlling the dynamic range of an audio reproduction in an interior of a vehicle, using variable parallel compression to the dynamics of the music.

2. Description of the Related Art

Audio systems within a vehicle are used to reproduce audio from a multimedia source for the occupants of the vehicle. The reproduced audio that is provided is dynamic in nature. That is, the volume level of the reproduced audio is constantly changing. Various portions of the reproduce audio are loud while other portions are soft, and such portions continuously follow each other. Unfortunately, background noise levels are generated within the vehicle, which drown out or mask portions of the reproduced audio. Background noise levels in vehicles are related to conditions such as speed, wind, engine, exhaust, and vibrations. Depending on the noise level of the background noise, lower or soft passages may be masked. Typically, engine idle speeds and exhaust systems tend to mask the low frequency levels while high engine rpm and wind noise tend to mask other frequency levels. As the background noise levels are increased, more passages of the reproduced audio are masked. Volume levels of the reproduced audio may be increased overall to bring the masked passages above the background noise level to make the masked passages audible over the background noise, however, this also increases the loud passages. By increasing the loud passages, the loud passages become too loud. If loud passages are limited, the reproduced audio loses its dynamic range.

Compression techniques have been used to increase the low-level portions of the audio signal. Conventional compression techniques rely on several variables to control the amount of compression and focus on squashing peaks in order to obtain a compressed audio signal. Adjustment of certain variables such as release times, rate of compression, onset of compression may work well for some audible signals but not well for others. Furthermore, it is difficult to correlate these variables to a single noise-related parameter such as speed, noise, or vibration. A conventional compression technique could be used that compresses the audio signal so that the high and low level portions of the signal are approximately the same volume. However, while this allows the low level portions, the dynamics of the audible signal is removed since the high level portions are at the approximate same volume level as the low level portions.

SUMMARY OF THE INVENTION

The present invention relates to a method for controlling the dynamic range of an audio reproduction in an interior of a vehicle using variable parallel compression.

In one aspect of the invention, a method is provided for controlling a dynamic range of audio reproduction in an interior of a vehicle. An input audio signal is received by an audio processor. The input audio signal is split into a first and a second processing path. The input audio signal of the second processing path is compressed. A noise-related parameter of the vehicle is characterized. A gain control is applied to the compressed audio signal of the second processing path in response to the noise-related parameter. The compressed and uncompressed audio signals are synchronously recombined. The combined audio signal is reproduced in the interior of the vehicle.

DETAILED DESCRIPTION OF PREFERRED EMBODIMENTS

Figure 1:
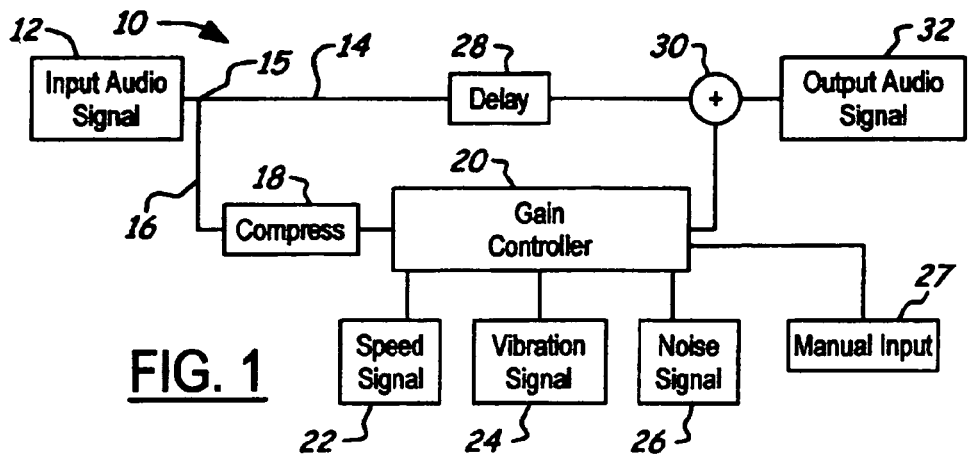
FIG. 1 illustrates a block diagram of an audio processing system according to a first preferred embodiment of the present invention.

Referring now to the Drawings and particularly to FIG. 1, there is shown a block diagram of an audio processing system 10 for controlling a dynamic range of an audio reproduction within the interior of a vehicle. An input audio signal 12 from an audio reproduction device is input to the audio processing system 10 for processing. The audio processing device may comprise a radio signal, a CD player, a DVD player, a tape player, or an MP3 player. The signal is split at a node 15 into a first processing path 14 and a second processing path 16 for parallel compression processing. The input audio signal 12 of the second processing path 16 is sent to a compression block 18 to compress the input audio signal 12. The compression block 18 could be a compression circuit or if in a digital format a compression algorithm may be used. The purpose of the compression block 18 is to raise the lower level portions of the audio input signal so as to increase the average power level to a predetermined power level.

After compression is completed on the input audio signal 12, the lower level passages and the higher level passages of the input audio signal 12 are at approximately the same volume. The compressed audio signal is then sent to a gain controller for applying a gain to the compressed audio signal. The gain controller 20 receives noise-related inputs from a plurality of devices located within the vehicle. The plurality of devices monitor the background noise of one or more noise-related parameters heard from within the interior of the vehicle. Noise-related parameters comprise speed, vibration, and noise (e.g. wind noise). At least one of a speed signal 22, a vibration signal 24, and a noise signal 26 are input to the gain controller 20. The gain controller 20 characterizes each input individually or in combination to determine the gain required to apply to the compressed signal to overcome the masking sound levels produced by the background noise. Alternatively, a manual input control 26 may be utilized so that a user operating the audio system can manually alter the level of parallel compression. The manual input control 26 can be activated and controlled from one or more control buttons on a multimedia control unit either individually or in combination. This allows the level of compression to be customized to a user's personal preference since various users respond to background noise differently.

While applying the gain to the compressed signal amplifies the low level portions of the audio signal above the noise mask of the background noise, the dynamics of the audible signal may be distorted. For example, a musical piece of art having a musical ensemble in which the music is compressed may result in the lower level portion of the ensemble having a same or substantially same volume as the higher level portion of the ensemble. To a person having a trained musical ear or knowledge of the musical piece, the dynamics of the ensemble is destroyed. To deter this distortion, the compressed signal is synchronously added by a summer 30 to the uncompressed signal that was split at node 15. A delay 28 may be required along the first processing path 14 to synchronously combine the compressed signal and uncompressed signal so that the two signals combine in phase. By summing the compressed signal and the uncompressed signal, the result is an output audio signal 32 that maintains a distinctive volume level differential between the high level portion and the low level portion with the low level portion being at a higher volume than the masking of the background noise, and in addition, retains much of the dynamics of the musical piece.

Figure 2:
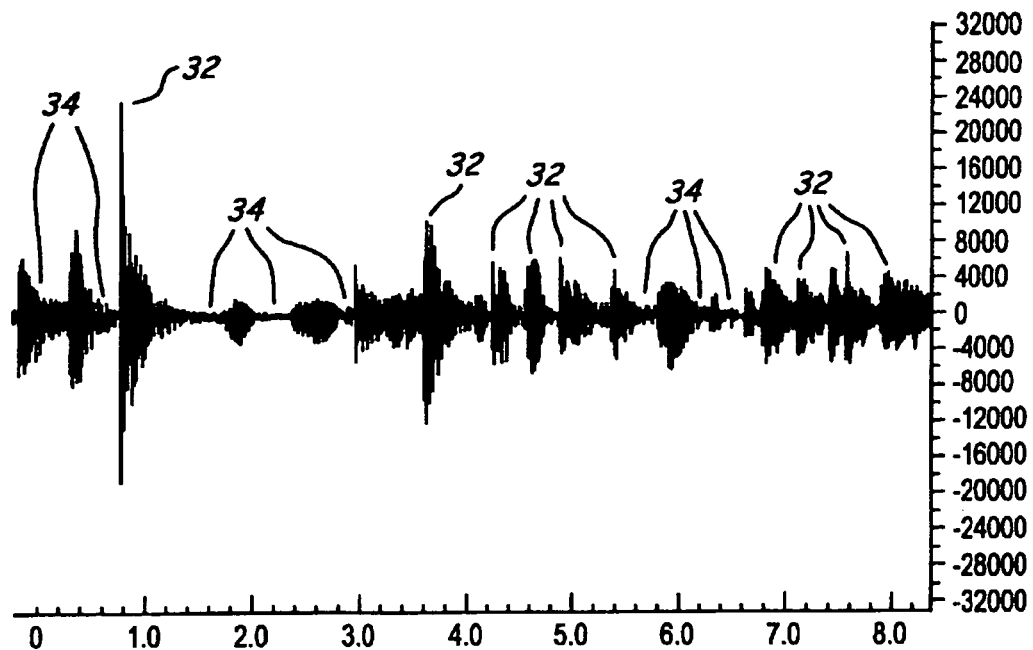
FIG. 2 is an uncompressed audio signal
Figure 3:
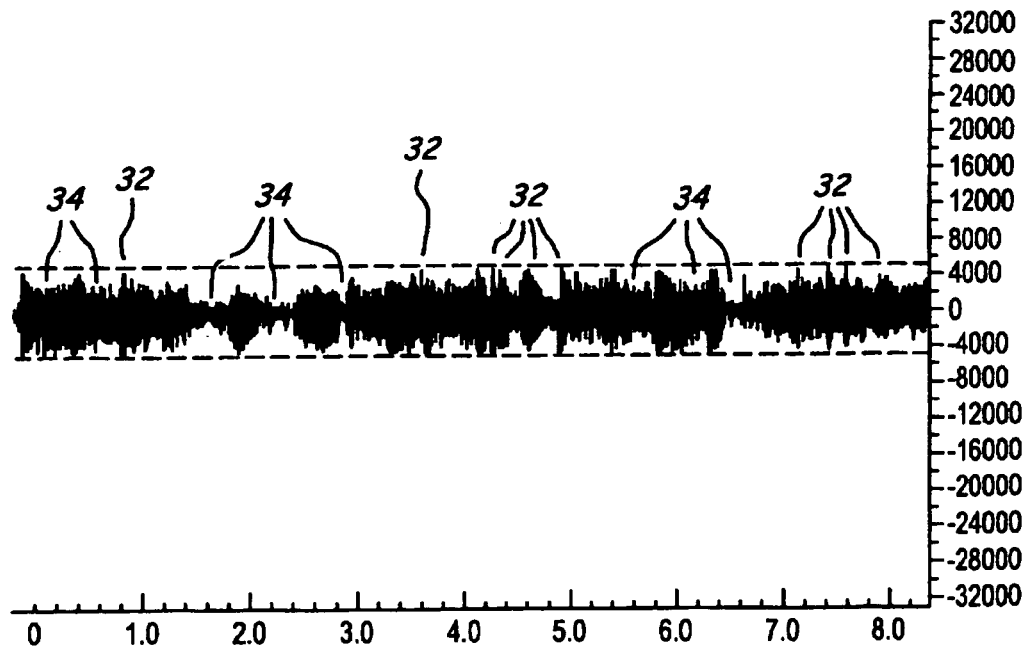
FIG. 3 is a serial compressed audio signal of FIG. 2.

FIG. 2 shows a graph of an uncompressed audio signal. The uncompressed audio signal represents a musical passage illustrating the high level volume portions 32 and the low level volume portions 34 of the input audio signal. Background noises may be at a level wherein the low level volume portions 34 are masked by the background noises. FIG. 3 illustrates a graph of the audio input signal in FIG. 2 after being compressed by a volume adjustment operation. In this instance, the automatic gain control attempts to produce a substantially constant average volume level output despite the amplitude fluctuations of the input audio signal. The high level volume portions 32 are reduced in gain while the low level volume portions 34 are amplified. The result is an output audio signal where the high volume levels and low volume levels are maintained close in amplitude output.

Figure 4:
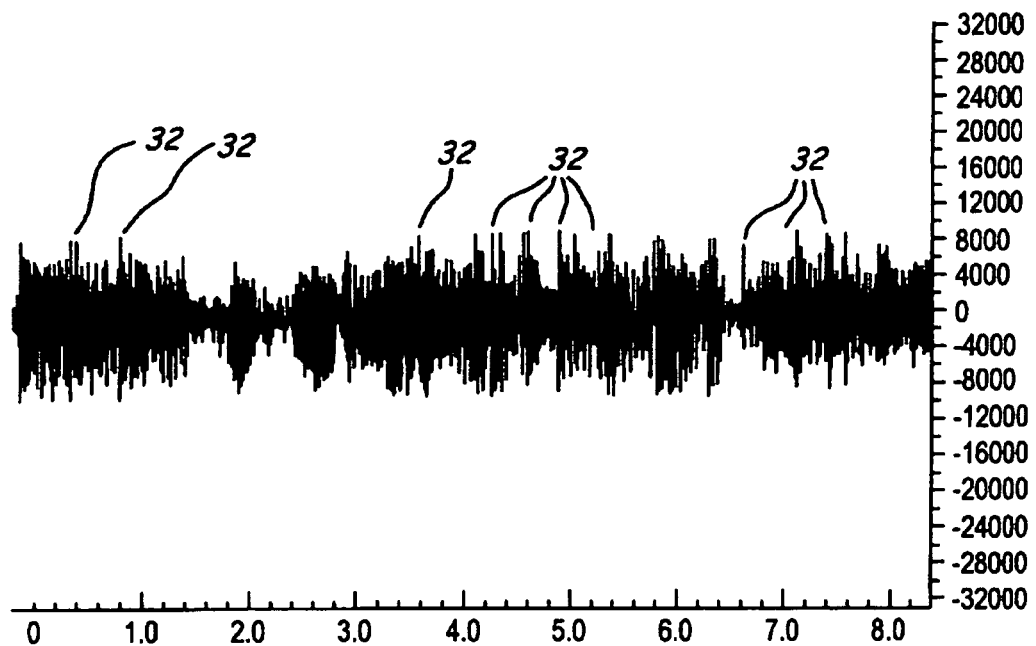
FIG. 4 is the serial compressed audio signal of FIG. 3 at increased volume.

FIG. 4 illustrates a graph of the audio input signal in FIG. 2 after serial compression has been applied to the audio input signal with increased volume level. During serial compression, the goal is to compress the audio signal so as to reduce the dynamic range of the audio input signal so that a ratio between the high and low level volume portions is smaller. While this compression method does allow the details of the low level volume to be amplified, the dynamics of the music is removed as serial compression techniques tend to squash the high level volume peaks in order to obtain a compressed audio output signal. This is shown in FIG. 4 where the high level volume portions 32 have now been attenuated. The method of serial compression typically includes applying a mathematical formula to a signal so that the portions of the audio input signal that are low are increased in volume.

Figure 5:
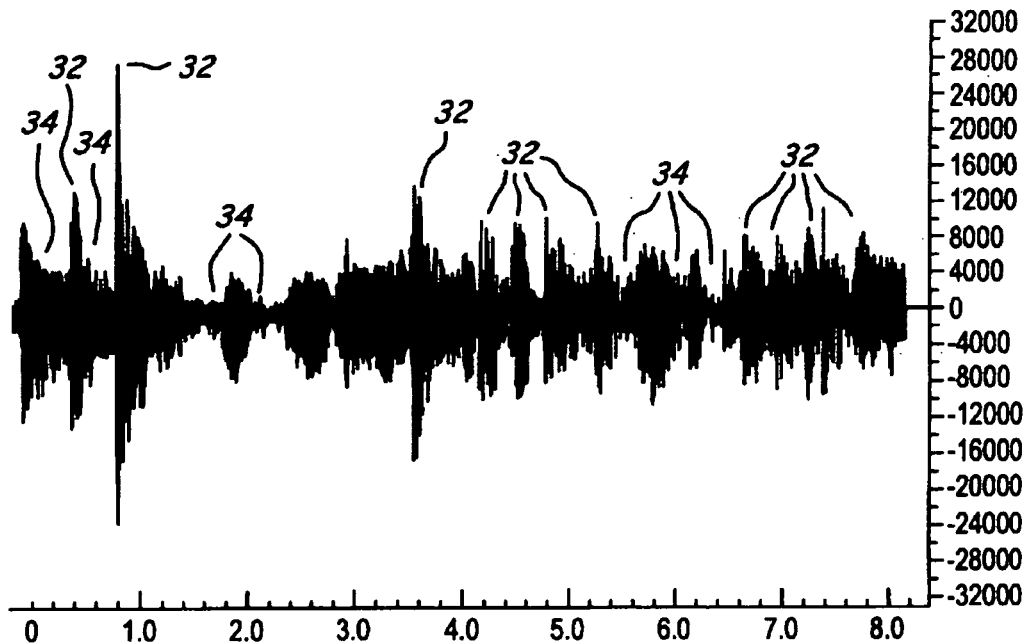
FIG. 5 is a parallel compressed audio signal.

FIG. 5 illustrates a graph of the audio signal in FIG. 2 after a parallel compression technique has been applied to the audio input signal according to the present invention. Using parallel compression, the audio signal is split into two signals. An aggressive compression is applied to one of the two audio signals. In the preferred embodiment, the aggressive compression comprises a single compression ratio with a rapid onset and a slow release. After compression has been applied to one of the two audio signals, gain is applied to the compressed audio signal based on the vehicle noise related parameters received from at least one noise-related sensor monitoring the background noise. The compressed audio signal is then added to the uncompressed signal. The resulting audio output signal provides amplified low level volume portions 34 that are higher than the background noise levels. In addition, by adding the uncompressed signal to the compressed signal, the resulting high level volume portions 32 of the combined signal are not attenuated, and as a result, the dynamics of the musical piece between the lower level volume portions 34 and the high level volume levels 32 are maintained. It is recognized that although the energy level of FIG. 4 and FIG. 5 have a same RMS (i.e., root mean squared), the dynamic range of the musical piece is maintained in FIG. 5.

Figure 6:
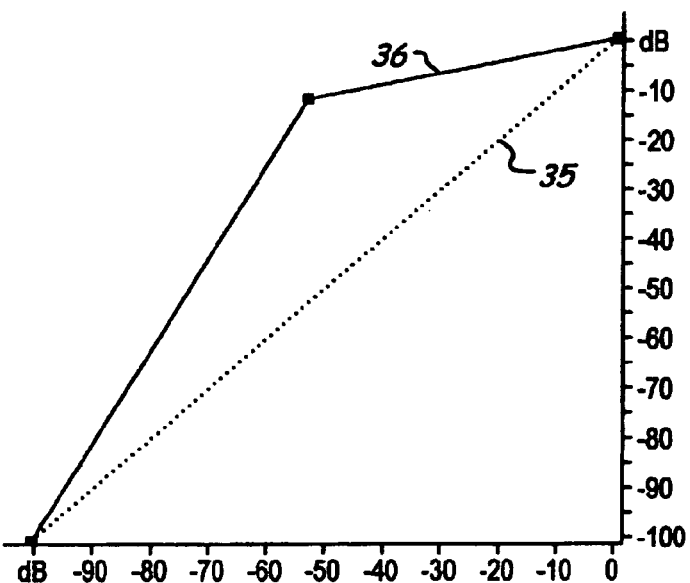
FIG. 6 illustrates a compression curve of a mathematical formula.

FIG. 6 illustrates an example of a compression curve for the present invention. The x-axis represents the average input level for an input audio signal while the y-axis represents the average output level after compression. A linear plot 35 represents an audio signal that is uncompressed and has no gain applied during audio processing. The ratio of the input level to output level is a 1:1 ratio. A nonlinear plot 36 represents the compression curve applied to an input audio signal for compression. For a respective input level of the audio input signal a respective gain is applied to amplify the output level. The nonlinear graph 36 of this particular compression curve illustrates that a larger amount of gain is applied at the lower volume levels than at the higher volume levels.

Figure 7:
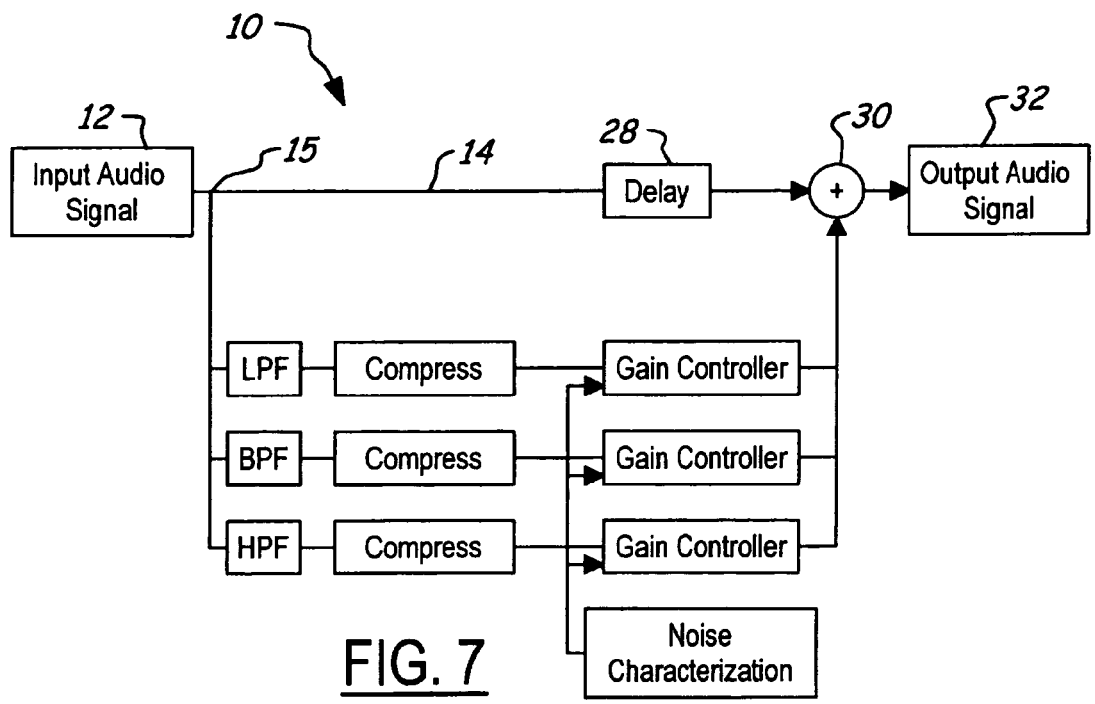
FIG. 7 illustrates a block diagram of an audio processing system according to a second preferred embodiment of the present invention.

When using compression processing, the algorithm may divide the audio input signal into separate frequency ranges for processing separately. FIG. 7 is a block diagram of an audio processing system according to a second preferred embodiment. The audio input signal is split and processed into a plurality of frequency passages using a low pass filter, a bandpass filter, and a high pass filter. Each frequency passage has an associated compression algorithm and gain control where the gain control is based off of noise characteristics of the vehicle. After gain control has been applied to each frequency passage, the compressed signals are combined along with the uncompressed signal and then output to the interior of the vehicle.

Figure 8:
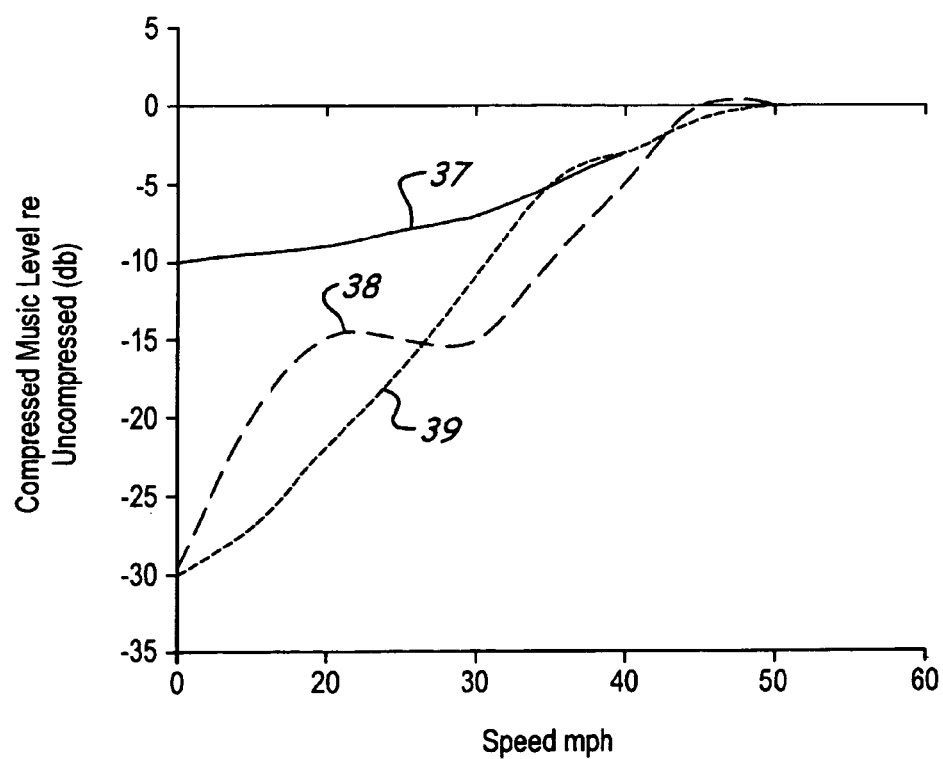
FIG. 8 illustrates a graph comparing the speed of a vehicle to level of the compressed signal relative to the input signal for low, mid, and high frequency compression.

FIG. 8 illustrates a graph comparing the speed of a vehicle to level of the compressed signal relative to the input signal for low, mid, and high frequency compression. When the vehicle is at 0 mph, engine idle noise is the dominant background noise present. Due to the engine idle background noise interfering with low frequency signal outputs, low frequency input signals 37 are increased more than high frequency input signals 39 to overcome the engine idle noise. As the vehicle speed increases, mid frequency levels are affected as a result of increased engine rpm. To overcome the background noise of the increased engine rpm, mid frequency input signals 38 are increased. At higher speeds, wind noise becomes an issue adding to the background noise. As a result, high frequency input signals 39 are increased to overcome the increased background noise caused by the wind noise. Various control devices can be implemented and monitored to provide input to drive the gain control. For example, an accelerometer can be attached to the engine to monitor and provide input to control low frequency background noise caused by engine idle. The powertrain control module can provide engine rpm data to control the mid frequency background noise caused by increased engine rpm. The speedometer can provide vehicle speed data to monitor and control the high frequency background noise caused by windnoise.

Figure 9:
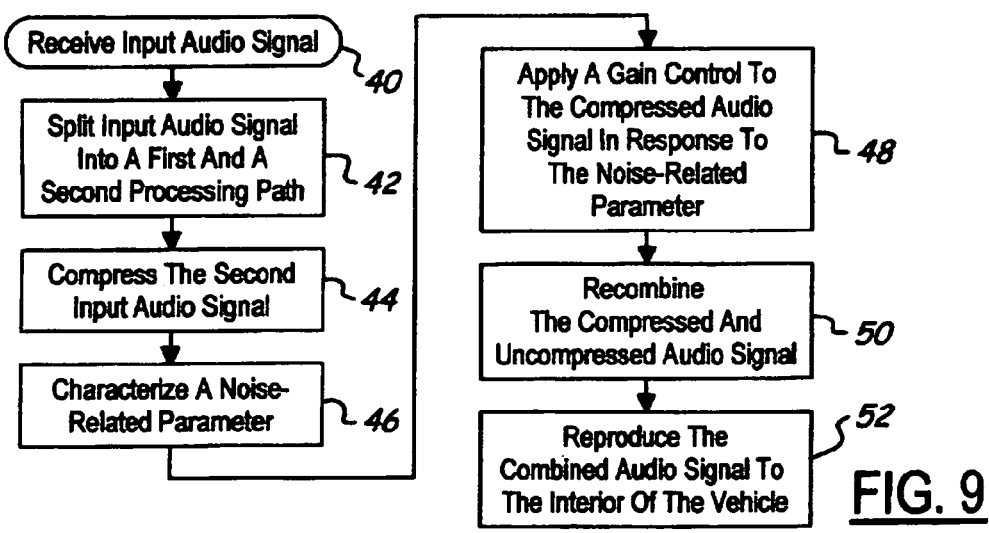
FIG. 9 illustrates a flow chart for a method for controlling the dynamic range of an audio reproduction within a vehicle using parallel compression.

FIG. 9 illustrates a flow chart for a method for controlling the dynamic range of an audio reproduction within an interior of a vehicle using parallel compression and noise-related parameter gain control. In step 40, the input audio signal is received containing the audio reproduction from a multimedia device. In step 42, the input audio signal is split along the first processing path and the second processing both. In step 43, the audio input signal of the second processing path is compressed by the compressing block. The compressing block may include a compressing circuit for analog data or a compression algorithm may be used if the input audio signal is received in the digital format or is converted from an analog to digital format. In step 46, the noise-related parameter is characterized. That is, the noise-related parameter or parameters are determined by either a direct measurement, direct input, or a calculation derived through a vehicle operating parameter. In step 48, a gain is applied to the compressed audio signal in response to the noise-related parameter. The noise related parameter may be related to an individual parameter such as speed, noise, and vibration, or may be a combination or two or more noise-related parameters. In step 50, the compressed signal and the uncompressed signal are synchronously added to form a unison audio output signal. The uncompressed signal of the first processing path may be delayed to synchronize the summing of the compressed signal and the uncompressed signal. In step 52, the output signal is reproduced to the interior of the vehicle.

The advantages of the present invention are notable in that the goal is not necessarily to compensate for peak volumes, but to bring the non-peak volumes up to an audible level above the background noise while maintaining the dynamic range between the low level volumes and the high level volumes for a respective audio output signal.

What is claimed is:

1. A method comprising the steps of:
   (a) receiving an input audio signal;
   (b) splitting the input audio signal into a first processing path and a second processing path;
   (c) compressing the input audio signal of the second processing path while not compressing the input audio signal of the first processing path by raising a low level portion of the input audio signal of the second processing path while not changing a high level portion of the input audio signal of the second processing path;
   (d) characterizing a noise-related parameter of the vehicle interior;
   (e) applying a gain control to the compressed audio signal of the second processing path in response to the noise-related parameter;
   (f) combining the compressed audio signal of the second processing path with the uncompressed audio signal of the first processing path; and
   (g) reproducing the combined audio signal to the interior of the vehicle.

2. The method defined in claim 1 wherein step (f) is performed by (1) delaying the uncompressed audio signal of the first processing path and (2) synchronously combining the uncompressed and compressed audio signal.

3. The method defined in claim 1 wherein step (e) is performed by applying a gain control to the compressed audio signal of the second processing path in response to the noise-related parameter and a manual input control.

4. The method defined in claim 1 wherein step (d) is performed by characterizing an amplitude of noise within the vehicle.

5. The method defined in claim 1 wherein step (d) is performed by characterizing a vehicle vibration.

6. The method defined in claim 1 wherein step (d) is performed by characterizing an engine speed.

7. The method defined in claim 1 wherein step (d) is performed by characterizing a vehicle speed.

8. The method defined in claim 1 wherein step (d) is performed by characterizing a combination of a vehicle vibration, an engine speed, and a vehicle speed.

9. A method of processing an input audio signal to generate an output audio signal within an interior space comprising the steps of:
   (a) receiving an input audio signal;
   (b) splitting the input audio signal into a first audio signal and a second audio signal;
   (c) compressing a dynamic range of the second audio signal by raising a low level portion of the input audio signal of the second processing path while not changing a high level portion of the input audio signal of the second processing path;
   (d) characterizing a noise-related parameter of an interior space;
   (e) varying a gain of the compressed second audio signal in accordance with a magnitude of the noise-related parameter; and
   (f) combining the uncompressed first audio signal and the compressed second audio signal to generate an output audio signal within the interior space.

10. The method defined in claim 9 wherein step (f) is performed by (1) delaying the uncompressed audio signal of the first processing path and (2) synchronously combining the uncompressed and compressed audio signal.

11. The method defined in claim 9 wherein step (e) is performed by applying a gain control to the compressed audio signal of the second processing path in response to the noise-related parameter and a manual input control.

12. The method defined in claim 9 wherein step (d) is performed by characterizing an amplitude of noise within the vehicle.

13. The method defined in claim 9 wherein step (d) is performed by characterizing a vehicle vibration.

14. The method defined in claim 9 wherein step (d) is performed by characterizing an engine speed.

15. The method defined in claim 9 wherein step (d) is performed by characterizing a vehicle speed.

16. The method defined in claim 9 wherein step (d) is performed by characterizing a combination of a vehicle vibration, an engine speed, and a vehicle speed.

* * * * *